United States Patent
Sudo

(10) Patent No.: US 10,825,533 B2
(45) Date of Patent: Nov. 3, 2020

(54) POWER ON FUSE READ OPERATION IN SEMICONDUCTOR STORAGE DEVICE AND OPERATION METHOD THEREOF

(71) Applicant: Winbond Electronics Corp., Taichung (TW)

(72) Inventor: Naoaki Sudo, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/242,017

(22) Filed: Jan. 8, 2019

(65) Prior Publication Data

US 2019/0214095 A1    Jul. 11, 2019

(30) Foreign Application Priority Data

Jan. 11, 2018 (JP) ................. 2018-002593

(51) Int. Cl.
*G11C 16/26* (2006.01)
*G11C 29/04* (2006.01)
(Continued)

(52) U.S. Cl.
CPC ........ *G11C 16/26* (2013.01); *G01R 19/16552* (2013.01); *G11C 5/143* (2013.01);
(Continued)

(58) Field of Classification Search
CPC ........... G11C 16/26; G11C 5/143; G11C 7/20; G11C 29/04; G11C 16/30; G11C 2029/0407; G01R 19/16552; G06F 8/40
See application file for complete search history.

(56) References Cited

U.S. PATENT DOCUMENTS 7,433,247 B2    10/2008 Zheng et al.
2003/0097618 A1*  5/2003 Kim ................. G06F 11/3648
                                                714/39

(Continued)

FOREIGN PATENT DOCUMENTS

CN    103794253    5/2014
JP    2007102931   4/2007
(Continued)

OTHER PUBLICATIONS

"Office Action of Taiwan Counterpart Application," issued on Dec. 10, 2019, p. 1-p. 8.

*Primary Examiner* — David Lam
(74) *Attorney, Agent, or Firm* — JCIPRNET

(57) ABSTRACT

A semiconductor memory device and an operation method thereof that can accurately read setting information from a memory cell array when a power supply is turned on are provided. The flash memory includes a memory cell array, a detecting portion, a ROM and a control portion. The detecting portion detects that the power supply is turned on. The ROM stores at least a code for performing a reading operation of the memory cell array and stores a special code in a specific address. The control portion controls the reading of the ROM. When the detecting portion detects the power-on of the power supply, the control portion reads the special code from the ROM and determines whether the read special code is correct or not, reads the code if the determination is correct and again reads the special code if the determination is incorrect.

10 Claims, 4 Drawing Sheets

(51) Int. Cl.
  *G11C 16/30*    (2006.01)
  *G01R 19/165*   (2006.01)
  *G11C 5/14*     (2006.01)
  *G11C 7/20*     (2006.01)

(52) U.S. Cl.
  CPC .............. G11C 7/20 (2013.01); G11C 16/30 (2013.01); G11C 29/04 (2013.01); *G11C 2029/0407* (2013.01)

(56) References Cited

U.S. PATENT DOCUMENTS

| | | | | |
|---|---|---|---|---|
| 2007/0081377 | A1* | 4/2007 | Zheng | G11C 29/027 |
| | | | | 365/96 |
| 2007/0147144 | A1* | 6/2007 | Tokiwa | G11C 29/76 |
| | | | | 365/200 |
| 2013/0141983 | A1* | 6/2013 | Ruths | G11C 16/20 |
| | | | | 365/185.21 |
| 2017/0168723 | A1* | 6/2017 | Li | G06F 3/0673 |
| 2019/0058334 | A1* | 2/2019 | Chan | H02J 7/007 |

FOREIGN PATENT DOCUMENTS

| | | |
|---|---|---|
| TW | I248086 | 1/2006 |
| TW | 201621906 | 6/2016 |

\* cited by examiner

POWER ON FUSE READ OPERATION IN SEMICONDUCTOR STORAGE DEVICE AND OPERATION METHOD THEREOF

CROSS-REFERENCE TO RELATED APPLICATION

This application claims the priority benefit of Japan application serial no. 2018-002593, filed on Jan. 11, 2018. The entirety of the above-mentioned patent application is hereby incorporated by reference herein and made a part of this specification.

BACKGROUND

Field of the Disclosure

The disclosure is directed to a semiconductor storage device, such as a flash memory and more particularly, to a power-on operation when a power supply is turned on.

Description of Related Art

An NAND-type flash memory uses a fuse cell to store a voltage setting for reading, programming, erasing or the like and a setting with respect to a user's option. The fuse cell is, for example, disposed in a storage area of a memory cell array and is incapable of being accessed by the user. When being powered on, as a power up operation, the flash memory reads the setting information stored in the fuse cell and load it into a configuration register. After the power up operation, a controller reads the setting information stored in the configuration register for controlling various operations.

For example, Patent literature 1 discloses a non-volatile memory featuring as follows. In a power-on operation, whether data read from a fuse cell configured for pre-check matches pre-defined pre-check data is determined, configuration information read from a main fuse cell is stored in a non-volatile memory area, whether data read from a fuse cell configured for post-check matches pre-defined post-check data is determined, and in a condition that the pre-check matches the post-check, the reading operation of the configuration ends.

CURRENTLY AVAILABLE TECHNICAL LITERATURE

Patent Literature

[Patent literature 1] U.S. Pat. No. 7,433,247

Problem to be Solved by the Disclosure

For example, in a flash memory supplied with a voltage of 3.0 V, when a voltage range which guarantees its operation is set to from 2.7 V to 3.3 V, a voltage level for starting a power-on operation when the power is on is approximately 2.2 V. This voltage is lower than the operation guaranteed voltage. The variation of a detection voltage at the power-on voltage level when the power is on occurs due to process variation or an operating temperature, and thus, if the power-on voltage level raises up to the operation guaranteed voltage level, a time for the power-on operation becomes longer, or a power-on detection and reset operation is repeatedly performed. Accordingly, the power-on voltage level has to be set to be slightly lower than the operation guaranteed voltage.

FIG. 1 is a diagram illustrating a reading operation of a fuse cell at a power-on voltage level. At a time t1, if the supply voltage raises up to 2.2 V as the power-on voltage level, it enters a power-on mode, where the setting information is read from a fuse cell of the memory cell array, and the setting information is loaded into the configuration register. Thereafter, the supply voltage raises up to operation guaranteed voltage ranging from 2.7 V to 3.3 V at a time t2.

The following problems exist in the power-on operation. In a condition that a micro-controller runs at the power-on voltage level of about 2.2 V, in comparison with a normal operation, the power supply voltage is low, and there is almost no operation margin. Thus, if a voltage variation occurs, a command code from a read-only memory (ROM) is incapable of being correctly read, such that the reading operation of the fuse cell may be out of control, or the reading of the ROM may be stuck halfway.

SUMMARY

The disclosure is to solve such problem in the related art and aims at providing a semiconductor storage device capable of accurately reading setting information from a memory cell array when a power supply is turned on.

Technical Means for Solving the Problem

In an operation method of a semiconductor storage device including a central processing unit (CPU) and a read-only memory (ROM) provided by the disclosure, the CPU reads a special code stored in the ROM, determines whether the read special code is correct or not, reads a code stored in the ROM when the determination is correct and again reads the special code when the determination is incorrect. The CPU controls an operation according to the read code.

In an embodiment, the CPU reads the special code at a cycle later than a cycle of a timing when data is read from the ROM in a normal operation. In an embodiment, the operation method includes a step of detecting the semiconductor storage device when the power supply is turned on, and the CPU reads the special code in response to the detection of the power-on of the power supply. In an embodiment, the CPU reads the setting information from the memory cell array according to the read code and stores the read setting information in a register.

Effect of the Disclosure

According to the disclosure, when it is detected that the power supply is turned on, the code can continue to be read only in the condition that the special code is correctly read from the ROM, thereby ensuring the accuracy of the data read from the ROM. As a result, the setting information can be accurately read from the memory cell array in the power-on operation.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Hereinafter, the embodiments of the disclosure will be described in detail with reference to the accompanying drawings. Herein, an NAND-type flash memory is exemplified as a preferred form. Moreover, it should be noted that the accompanying drawings is emphatically illustrated in parts for clarity, while scales of actual devices are different therefrom.

EMBODIMENTS

Figure 1:
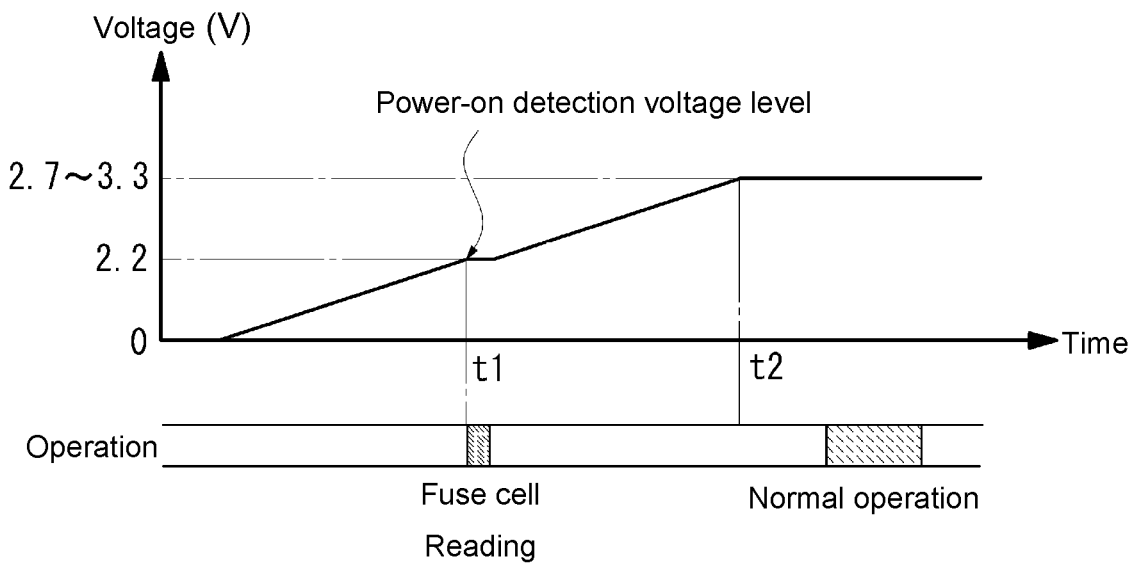
FIG. 1 is a diagram illustrating a reading operation of a fuse cell at a power up detection level.
Figure 2:
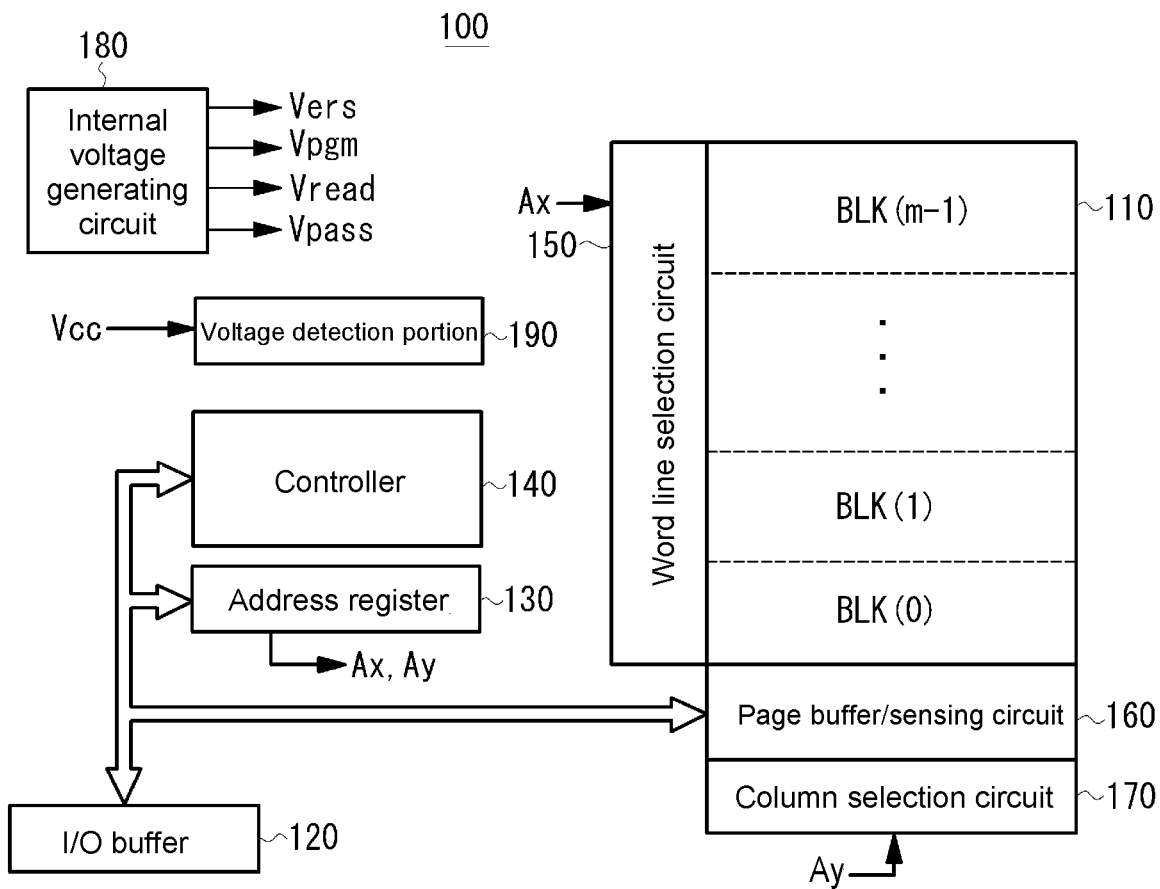
FIG. 2 is a diagram illustrating the configuration of a flash memory according to an embodiment of the disclosure.

The configuration of major parts of a flash memory of an embodiment of the disclosure is illustrated in FIG. 2. However, the configuration of the flash memory illustrated herein is merely an example, and the disclosure is not necessarily limited to such configuration.

A flash memory 100 of the present embodiment includes a memory cell array 110, an input/output (I/O) buffer 120, an address register 130, a controller 140, a word line selection circuit 150, a page buffer/sensing circuit 160, a column selection circuit 170, an internal voltage generating circuit 180 and a voltage detection portion 190. The memory cell array 110 includes a plurality of memory cells arranged in an array. The I/O buffer 120 is connected with an external I/O terminal I/O. The address register 130 receives address data from the I/O buffer 120. The controller 140 receives command data from the I/O buffer 120 for controlling each portion. The word line selection circuit 150 receives row address information Ax from the address register 130, decodes the row address information Ax and performs block selection and word line selection based on the decoding result. The page buffer/sensing circuit 160 stores data read from a page selected by the word line selection circuit 150 or stores input data to be programmed in the selected page. The column selection circuit 170 receives column address information Ay from the address register 130, decodes the column address information Ay and selects data of a column address in the page buffer/sensing circuit 160 based on the decoding result. The internal voltage generating circuit 180 generates various voltages (including a write voltage Vpgm, a pass voltage Vpass, a read pass voltage Vread and an erase voltage Vers) required for reading, programming and erasing data. The voltage detection portion 190 monitors a power supply voltage Vcc provided from an external terminal when the power supply is turned on and detects a power-on voltage level.

The memory cell array 110 has m memory blocks BLK(0), BLK(1), . . . and BLK(m−1) in a column direction. A plurality of NAND string units formed by connecting a plurality of memory cells in series are formed in a storage block. Additionally, the memory cell array 110 include a fuse cell. The fuse cell stores setting information related to a setting of a voltage for the operation of the flash memory or a setting of a user's option. The fuse cell is an area incapable of being accessed by the user.

In a reading operation, a positive voltage is applied to a bit line, a voltage of 0 V is applied to a selected word line, a pass voltage is applied to a non-selected word line to turn on a bit line side selection transistor and a source line side selection transistor, and a voltage of 0 V is applied to a common source line. In a programming operation, a high-level program voltage Vpgm is applied to the selected word line. An intermediate-level voltage is applied to the non-selected word line to turn on the bit line side selection transistor and turn off the source line side selection transistor. A voltage at a level corresponding to data of "0" or "1" is supplied to a bit line GBL. In an erasing operation, a voltage of 0 V is applied to a selected word line in a block, a high-level voltage is applied to a P well, and electrons of a floating gate are extracted to a substrate, thereby erasing the data in units of blocks.

The voltage detection portion 190 monitors a voltage level of the power supply voltage Vcc supplied to the flash memory 100 when the power supply is turned on. When the supplied voltage level reaches the power-on voltage level, a power-on detection signal is output to the controller 140. The power-on voltage level is slightly lower than a voltage for the flash memory performing a normal operation. For example, when the voltage Vcc supplied to the flash memory is 3.0 V (where an operation guaranteed level is, for example, from 2.7 V to 3.3 V), the power-on voltage level is about 2.2 V.

Figure 3:
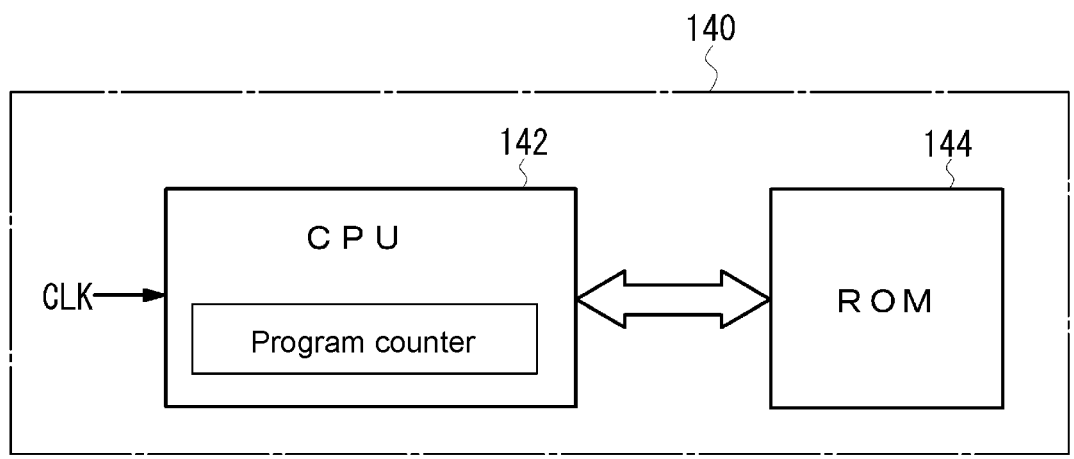
FIG. 3 is a diagram illustrating an example of the internal configuration of a controller according to an embodiment of the disclosure.

Referring to FIG. 3, the controller 140 includes a central processing unit (CPU) 142 or a read-only memory (ROM) 144. The ROM 144 stores a code of a command or data for performing a power-on operation, a reading operation, a programming operation or an erasing operation. The CPU 142 reads for example, a command code from the ROM 144 according to an address set in a program counter, decodes the read command code and controls the power-on operation, the reading operation, the programming operation and the erasing operation according to the decoded command.

Figure 4:
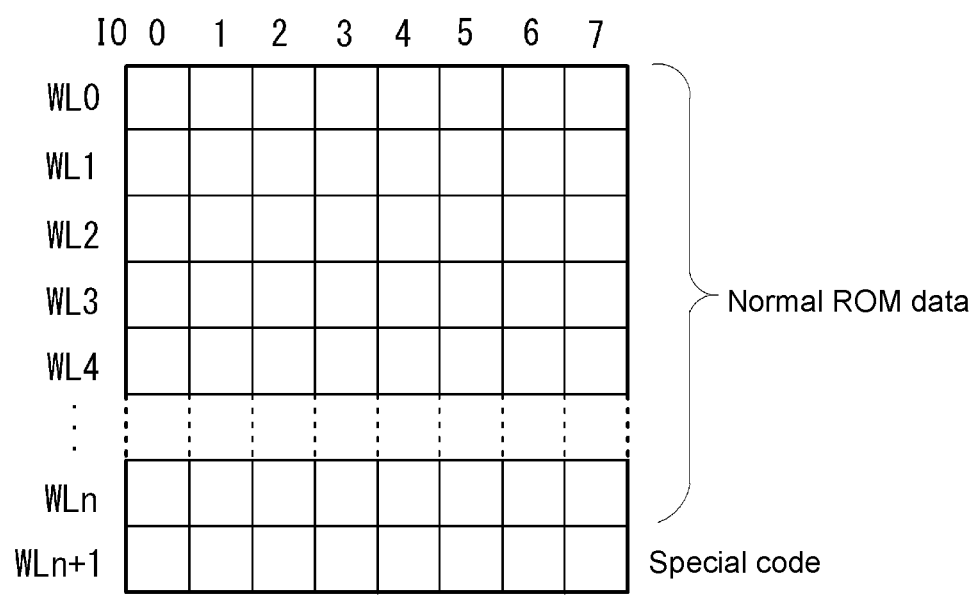
FIG. 4 is a schematic diagram illustrating an example of the configuration of read-only memory (ROM) according to an embodiment of the disclosure.

The controller 140, if receiving the power-on detection signal from the voltage detection portion 190, is transited to the power-on operation mode, but one power-on operation includes a reading operation of a fuse cell of the memory cell array 110. In the present embodiment, the ROM 144 stores a special code for determining whether the ROM is correctly read in the power-on operation. FIG. 4 illustrates an example of an address map of the storage area in the ROM 144. The ROM 144 is composed of an array of rows and columns, which is an address space including row addresses of WL0, WL1, WL2, . . . and WLn+1, and one row stores data of 8 bits, for example. In the row address WL0 to the row address WLn, codes, such as commands, are stored in the normal operation, and further, in the additional row address WLn+1, a special code for determining whether the command code read from the ROM in the power-on operation is correctly read is stored. The special code refers to a data mode containing "0" and "1", for example, a data mode of AAh (1010 . . . ), 55h (0101 . . . ) or the like.

When the CPU 142 reads the data from the ROM 144, the row address of the ROM 144 is specified according to the row address set in the program counter, and the CPU 142 receives the 8-bit command code which is specified according to the row address from the ROM 144. In a condition that the power-on operation is performed in response to the power-on detection signal, the row address WLn+1 is first set in the program counter, the 8-bit special code specified by the row address WLn+1 is read from the ROM 144, and whether the read special code matches an expected value (wherein the expected value is the special code) is determined. If the read special code matches, the row address set in the program counter is branched to another row address, and then, the command code for the reading operation of the fuse cell is read from the ROM 144. If the special code does not match the expected value, the special code is again read from the ROM 144, and whether the special code matches the expected value is determined. By controlling the reading operation of the ROM 144, the command code for the reading operation of the fuse cell may be correctly read therefrom, thereby reading the correct setting information from the fuse cell.

Figure 5:
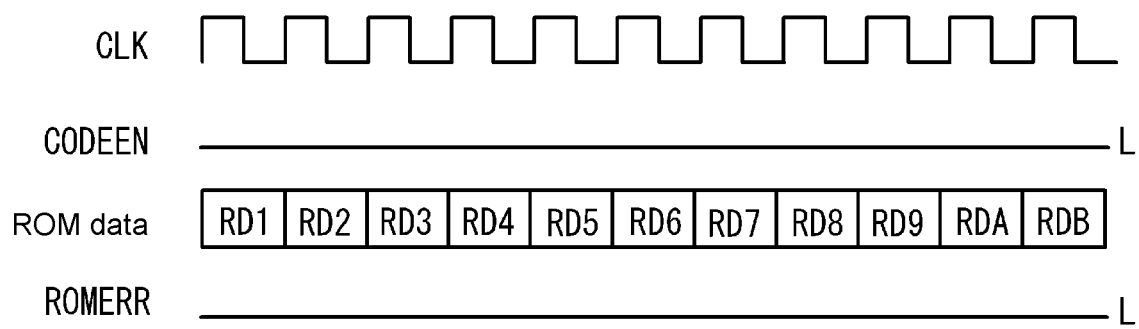
FIG. 5 is a diagram illustrating a timing of reading data from the ROM in a normal operation according to an embodiment of the disclosure.

FIG. 5 illustrates an example of a timing of reading the ROM in the normal operation. In the normal operation, i.e., at an operation guaranteed voltage of which a supply voltage level is sufficient. Thus, it may be guaranteed that a state of the data stored in the ROM 144 may be accurately read. The CPU 142 is in synchronization with a rising edge of a clock signal CLK, such that the program counter is incremented, and the data is sequentially read from the ROM 144. An example where "RD1", "RD2", ... "RDA" and "RDB" are read from the ROM 144 in synchronization with the clock signal CLK is illustrated. If "RD1" is read, the CPU 142 decodes it and performs the control corresponding to the decoded content. Meanwhile, the CPU 142 reads and decodes "RD2" next and performs the control corresponding to the decoded content. Afterwards, the control corresponding to the read command code is performed in the same way.

Figure 6:
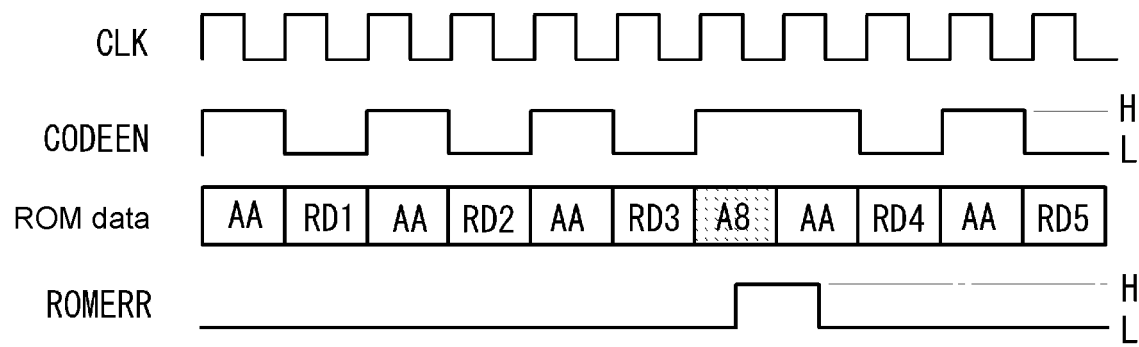
FIG. 6 is a diagram illustrating a timing of reading data from the ROM in a power-on operation according to an embodiment of the disclosure.

FIG. 6 illustrates an example of a timing of reading the fuse cell of the ROM in the power-on operation. In the power-on operation, the CPU 142 sets the row address WLn+1 in the program counter, reads the special code from the ROM 144 and determines whether the read special code is correct or not. For example, if the special code is AAh, whether the read special code matches the expected value (AAh) is determined. If yes, it is determined that the special code is correctly read, the CPU 142 breaches the row address set in the program counter and reads the command code for performing the reading operation of the fuse cell from the ROM 144.

On the other hand, if the special code does not match the expected value, it is determined that the special code is not correctly read, the CPU 142 maintains the row address WLn+1 set in the program counter as it is, again reads the special code from the ROM 144 and determines the read special code is correctly read or not. The process is repeatedly performed until the special code matches the expected value. In this way, the CPU 142 reads the command code for performing the read operation of the fuse cell only in the condition that the special code is correctly read.

In FIG. 6, a CODEEN signal represents an access timing for reading the special code. When the CODEEN signal is at a high voltage level (H level), the row address WLn+1 is set in the program counter, and the special code is read. When the CODEEN signal is at a low voltage level (L level), the address for reading the fuse cell is set in the program counter. In addition, a ROMERR signal indicates whether the special code is correct or not. For example, at the H level, it indicates that the special code is incapable of being correctly read, and at the L level, it indicates that the special code is correctly read. When the power supply is turned on, in the consideration that the supply voltage is unstable, a read speed of the special code is slower than a read speed in the normal operation, and in this case, the special code is read is at ½ speed. In addition, the CPU 142 reads the data from the ROM 144 in response to a falling edge of the clock signal CLK.

When the CODEEN signal is at the H level, the row address WLn+1 is set in the program counter, the CPU 142 reads the special code from the ROM 144 in response to the falling edge of the clock signal CLK. The special code is set to AAh. The CPU 142 stores the special code read from the ROM 144 in a register and compares the register with a register storing the expected value (AAh). If the two registers match each other, the ROMERR signal is at the L level, and it indicates that the special code is correctly read. In response to the ROMERR signal which is at the L level and the CODEEN signal transited from the H level to the L level, the row address of the command code for the reading operation of the fuse cell is set in the program counter. Then, the CPU 142, in response to a falling edge of a next clock signal CLK, reads "RD1" from the ROM 144, decodes "RD1" and performs the command. Afterwards, whenever the special code is correctly read, the address set in the program counter is incremented.

If the special code read from the ROM 144 is A8h (which is error data), as the read special code (A8h) does not match the expected value (AAh), the ROMERR signal is transited to the H level, and it indicates that the special code is not correctly read. A period that the ROMERR signal is at the H level is equal to a cycle of the clock signal CLK. If the ROMERR signal is transited to the H level, in response thereto, the H level of the CODEEN signal is maintained. Thus, the row address WLn+1 set in the program counter is maintained as it is, and the CPU 142 again reads the special code of the row address WLn+1 at the falling edge of the next clock signal CLK. If the read special code is again AAh, "RD4" corresponding to a next command code is read based on the row address specified by the program counter.

Figure 7:
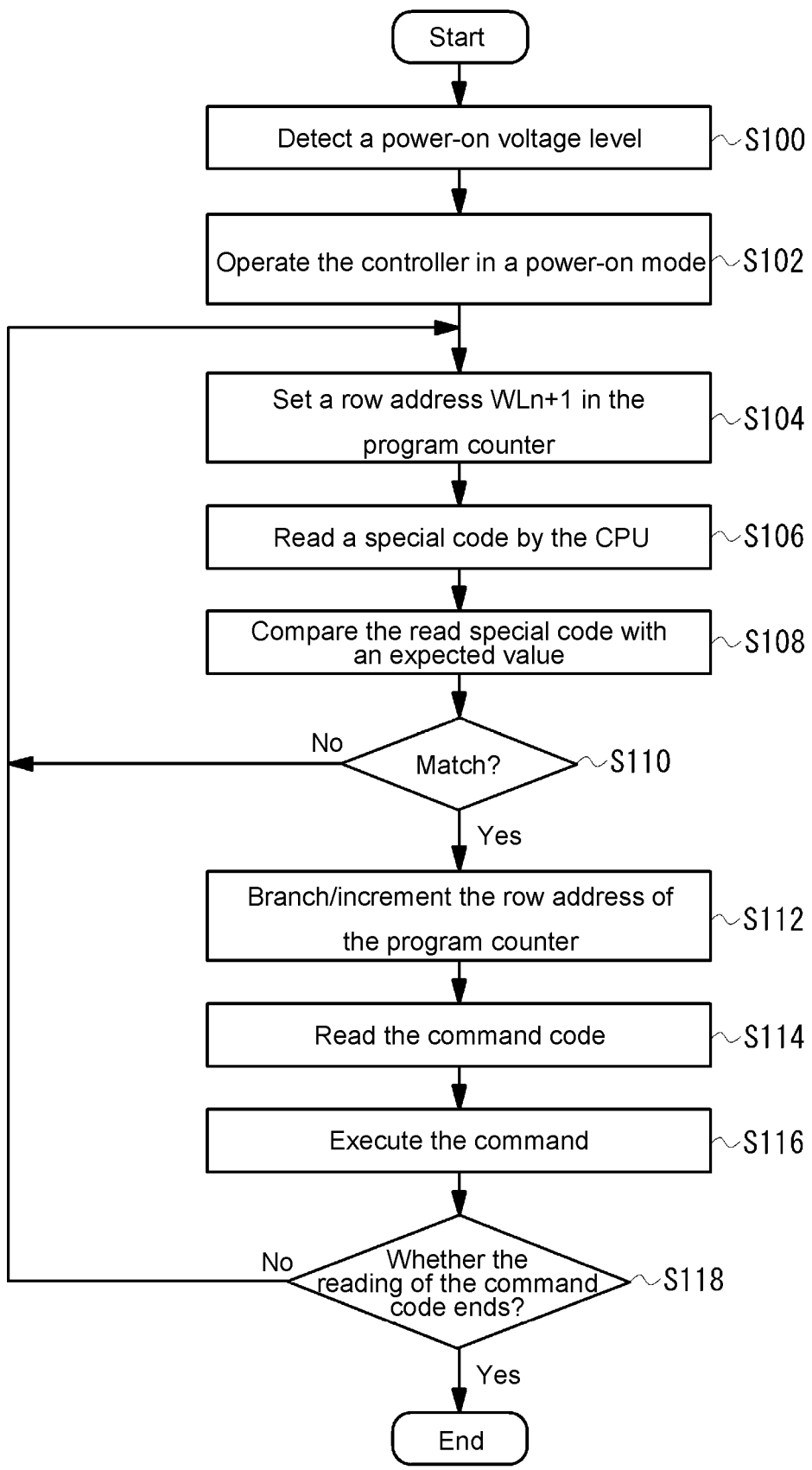
FIG. 7 is a flowchart illustrating the reading operation of the data of the ROM in the power-on operation according to an embodiment of the disclosure.

FIG. 7 illustrates a process flow of the reading operation of the fuse cell in the power-on operation in the present embodiment. When the power supply is turned on, if a power-on voltage level is detected by the voltage detection portion 190 (step S100), a detected signal is provided to the controller 140, and the controller 140 starts its operation in a power-on mode (step S102). A row address WLn+1 is set in the program counter (step S104), and a special code is read from the ROM 144 in synchronization with the clock signal CLK (step S106). Next, the CPU 142 compares the read special code with an expected value (wherein the expected value is the special code) (step S108), if the two match each other, (step S110), branches the address set in the program counter to an address storing the command code for performing the reading operation of the fuse cell (step S112) and reads the command code from the ROM 144 (step S114). The CPU 142 performs the reading operation of the setting information from the fuse cell of the memory cell array based on the read command code (step S116). When the reading of a series of command codes for performing the reading operation of the fuse cell ends (step S118), the power-on operation related to the reading of the fuse cell is ended. Finally, the setting information read from the fuse cell is loaded into the configuration register.

When the reading of a series of command codes does not end, step S104 is returned to, and the row address WLn+1 is again set in the program counter (step S104), and the special code is read (step S106). If the special code matches the expected value (steps S108 and S110), the row address set in the program counter is branched (step S112). A row address which is the previous row address incremented by 1 or one which is the previous row address subtracted by 1 is set in the program counter. In this way, the next command code is read from the ROM and executed.

On the other hand, when the special code does not match the expected value, the special code is again read to be compared with the expected value. As a result, the process is repeatedly performed until the special code matches the expected value. In comparison with the voltage in the normal operation, the voltage in the power-on voltage level is lower and tends to the occurrence of voltage variation, which easily leads to the occurrence of the inconsistency between the special code and the expected value.

Based on the above, in the present embodiment, the command code can be read only when the special code is correctly read, and thus, the accuracy of the read command code can be so ensured. Therefore, the reading of the fuse cell of the memory cell array can be correctly performed, and the read setting information can be correctly loaded into the configuration register.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A semiconductor storage device, comprising:
   a memory cell array;
   a detecting portion, detecting that a power supply is turned on;
   a read-only memory (ROM), storing at least a code for performing a reading operation of the memory cell array and storing a special code for determining whether the ROM is correctly read the code when the power supply is turned on in a specific address; and
   a control portion, controlling the reading of the ROM,
   wherein when the detecting portion detects that the power supply is turned on, the control portion reads the special code from the ROM, determines whether the read special code is correct or not, reads the code for performing the reading operation of the memory cell array if the determination is correct and again reads the special code if the determination is incorrect.

2. The semiconductor storage device as recited in claim 1, wherein
   the control portion reads the setting information stored in the memory cell array according to the read code and sets the read setting information in a register.

3. The semiconductor storage device as recited in claim 1, wherein
   the control portion reads the ROM in synchronization with a clock signal and reads the special code at a cycle later than a cycle of a timing when the ROM is read in a normal operation.

4. The semiconductor storage device as recited in claim 1, wherein
   the special code is a data mode containing 0 and 1,
   the control portion comprises a central processing unit (CPU), and the CPU reads the special code or the code according to an address of a program counter.

5. The semiconductor storage device as recited in claim 1, wherein
   the detecting portion detects a supply voltage reaching a fixed value of the power supply when being turned on, and the fixed value is lower than an operating voltage of the semiconductor storage device.

6. The semiconductor storage device as recited in claim 1, wherein
   the memory cell array is an NAND-type non-volatile memory cell array.

7. An operation method of a semiconductor storage device comprising a CPU and an ROM, comprising:
   by the CPU, reading a special code stored in the ROM, determining whether the read special code is correct or not, reading a code stored in the ROM for performing a reading operation when the determination is correct and again reading the special code when the determination is incorrect; and
   by the CPU, controlling an operation according to the read code.

8. The operation method as recited in claim 7, comprising:
   by the CPU, reading the special code at a cycle later than a cycle of a timing when reading data from the ROM in a normal operation.

9. The operation method as recited in claim 7, comprising:
   detecting the semiconductor memory device that is powered on; and
   by the CPU, reading the special code in response to the power-on.

10. The operation method as recited in claim 7, comprising:
    by the CPU, reading setting information from the memory cell array according to the read code and storing the read setting information in a register.

* * * * *